(12) United States Patent
Hudson et al.

(10) Patent No.: US 7,241,683 B2
(45) Date of Patent: Jul. 10, 2007

(54) STABILIZED PHOTORESIST STRUCTURE FOR ETCHING PROCESS

(75) Inventors: Eric Hudson, Berkeley, CA (US); S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 10 days.

(21) Appl. No.: 11/076,087

(22) Filed: Mar. 8, 2005

(65) Prior Publication Data

US 2006/0205220 A1 Sep. 14, 2006

(51) Int. Cl.
H01L 21/4763 (2006.01)

(52) U.S. Cl. ............... 438/637; 438/639; 438/942; 438/945; 438/947; 257/758

(58) Field of Classification Search ............ 438/942, 438/945, 947, 637, 639; 257/758
See application file for complete search history.

(56) References Cited

U.S. PATENT DOCUMENTS

| 4,151,034 A | 4/1979 | Yamamoto et al. |
| 4,414,059 A | 11/1983 | Blum et al. |
| 4,795,529 A | 1/1989 | Kawasaki et al. |
| 5,273,609 A | 12/1993 | Moslehi |
| 5,296,410 A | 3/1994 | Yang |
| 5,328,810 A * | 7/1994 | Lowrey et al. ............ 430/313 |
| 5,498,312 A | 3/1996 | Laermer et al. |
| 5,501,893 A | 3/1996 | Laermer et al. |
| 5,562,801 A | 10/1996 | Nulty |
| 5,882,535 A | 3/1999 | Stocks et al. |
| 5,942,446 A | 8/1999 | Chen et al. |
| 6,025,255 A | 2/2000 | Chen et al. |
| 6,046,115 A | 4/2000 | Molloy et al. |

(Continued)

FOREIGN PATENT DOCUMENTS

DE 10059836 A1 6/2002

(Continued)

OTHER PUBLICATIONS

Eto et al., "High Selectivity Photoresist Ashing by the Addition of $NH_3$ to $CF_4/O_2$ or $CHF_3/O_2$", SID 99 Digest, pp. 844-847.

(Continued)

Primary Examiner—Zandra V. Smith
Assistant Examiner—Christy Novacek
(74) Attorney, Agent, or Firm—Beyer Weaver LLP

(57) ABSTRACT

A method for forming features in an etch layer is provided. A first mask is formed over the etch layer where the first mask defines a plurality of spaces with widths. The first mask is laterally etched where the etched first mask defines a plurality of spaces with widths that are greater than the widths of the spaces of the first mask. A sidewall layer is formed over the etched first mask where the sidewall layer defines a plurality of spaces with widths that are less than the widths of the spaces defined by the etched first mask. Features are etched into the etch layer through the sidewall layer, where the features have widths that are smaller than the widths of the spaces defined by the etched first mask. The mask and sidewall layer are removed.

17 Claims, 12 Drawing Sheets

U.S. PATENT DOCUMENTS

| | | |
|---|---|---|
| 6,051,503 A | 4/2000 | Bhardwaj et al. |
| 6,071,822 A | 6/2000 | Donohue et al. |
| 6,074,959 A | 6/2000 | Wang et al. |
| 6,100,200 A | 8/2000 | Van Buskirk et al. |
| 6,127,273 A | 10/2000 | Laermer et al. |
| 6,153,490 A * | 11/2000 | Xing et al. ................. 438/396 |
| 6,187,685 B1 | 2/2001 | Hopkins et al. |
| 6,200,822 B1 | 3/2001 | Becker et al. |
| 6,211,092 B1 | 4/2001 | Tang et al. |
| 6,214,161 B1 | 4/2001 | Becker et al. |
| 6,261,962 B1 | 7/2001 | Bhardwaj et al. |
| 6,284,148 B1 | 9/2001 | Laermer et al. |
| 6,303,512 B1 | 10/2001 | Laermer et al. |
| 6,316,169 B1 | 11/2001 | Vahedi et al. |
| 6,326,307 B1 | 12/2001 | Lindley et al. |
| 6,368,974 B1 | 4/2002 | Tsai et al. |
| 6,387,287 B1 | 5/2002 | Hung et al. |
| 6,403,491 B1 | 6/2002 | Liu et al. |
| 6,406,995 B1 | 6/2002 | Hussein et al. |
| 6,489,632 B1 | 12/2002 | Yamazaki et al. |
| 6,569,774 B1 | 5/2003 | Trapp |
| 6,617,253 B1 | 9/2003 | Chu et al. |
| 6,632,903 B2 | 10/2003 | Jung et al. |
| 6,656,282 B2 | 12/2003 | Kim et al. |
| 6,740,977 B2 | 5/2004 | Ahn et al. |
| 6,750,150 B2 | 6/2004 | Chung et al. |
| 6,780,708 B1 | 8/2004 | Kinoshita et al. |
| 6,833,325 B2 | 12/2004 | Huang et al. |
| 6,916,746 B1 | 7/2005 | Hudson et al. |
| 6,924,191 B2 * | 8/2005 | Liu et al. ................. 438/241 |
| 2004/0072430 A1 * | 4/2004 | Huang et al. ............. 438/689 |
| 2004/0072443 A1 * | 4/2004 | Huang et al. ............. 438/710 |
| 2004/0126705 A1 | 7/2004 | Lu et al. |
| 2005/0037624 A1 | 2/2005 | Huang et al. |
| 2005/0048787 A1 | 3/2005 | Negishi et al. |
| 2006/0115978 A1 * | 6/2006 | Specht et al. ............. 438/637 |

FOREIGN PATENT DOCUMENTS

| | | |
|---|---|---|
| EP | 0822582 A2 | 2/1998 |
| JP | S63-13334 | 1/1988 |
| JP | 07226397 | 8/1995 |
| JP | 09036089 | 2/1997 |
| JP | 2001068462 | 3/2001 |
| WO | 00/30168 | 5/2000 |
| WO | 01/04707 | 1/2001 |
| WO | 01/29879 A2 | 4/2001 |
| WO | 01/29879 A3 | 4/2001 |

OTHER PUBLICATIONS

International Search Report, dated Feb. 24, 2004 for PCT/US03/31712.

International Search Report, dated Jun. 29, 2004 for PCT/US03/31712.

International Search Report, dated Sep. 10, 2004 for PCT/US04/10170.

U.S. Appl. No. 10/860,833, filed Jun. 3, 2004.

U.S. Appl. No. 11/016,455, filed Dec. 16, 2004.

U.S. Office Action mailed Oct. 20, 2003, from U.S. Appl. No. 10/295,601.

U.S. Office Action mailed May 27, 2004, from U.S. Appl. No. 10/295,601.

U.S. Office Action mailed Jun. 24, 2004, from U.S. Appl. No. 10/411,520.

U.S. Office Action mailed Oct. 5, 2004, from U.S. Appl. No. 10/648,953.

U.S. Office Action mailed Mar. 21, 2005, from U.S. Appl. No. 10/648,953.

U.S. Office Action mailed Jun. 23, 2005 from U.S. Appl. No. 10/674,675.

* cited by examiner

STABILIZED PHOTORESIST STRUCTURE FOR ETCHING PROCESS

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle may be a transparent plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Various generations of photoresist are known. 193 nm and higher generation photoresist materials have been found to have problems being soft resulting in low etch selectivity, line edge roughness, striation, and line wiggling. Line edge roughness may be due to modifications to the photoresist mask, such as chemically etching away part of the photoresist mask or may be due to non-uniform polymer deposition. Non-uniform polymer deposition may be dependent on gases used, surface material polymer sticking coefficients, or resputtering. Line wiggling is believed to be related to stress caused by deposition of material on the photoresist mask. Non-uniform deposition on the photoresist mask may cause line wiggling stress.

SUMMARY OF THE INVENTION

To achieve the foregoing and in accordance with the purpose of the present invention a method for forming features in an etch layer is provided. A first mask is formed over the etch layer wherein the first mask defines a plurality of spaces with widths. The first mask is laterally etched where the etched first mask defines a plurality of spaces with widths, wherein the widths of the spaces of the etched first mask are greater than the widths of the spaces of the first mask. A sidewall layer is formed over the etched first mask wherein the sidewall layer wherein the sidewall layer defines a plurality of spaces with widths that are less than the widths of the spaces defined by the etched first mask. Features are etched into the etch layer through the sidewall layer, where the features have widths that are smaller than the widths of the spaces defined by the etched first mask. The mask and sidewall layer are removed.

In another manifestation of the invention, a method for forming features in an etch layer is provided. A plurality of vias are etched into the etch layer. A trench photoresist mask is formed. A sidewall layer is formed over the trench mask and on sidewalls of the plurality of vias. Trenches are etched into the etch layer through the sidewall layer.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The invention provides features with small critical dimensions (CD). More specifically, the invention provides features with CD's that are less than the CD of the photoresist pattern used to etch the feature.

Figure 1:
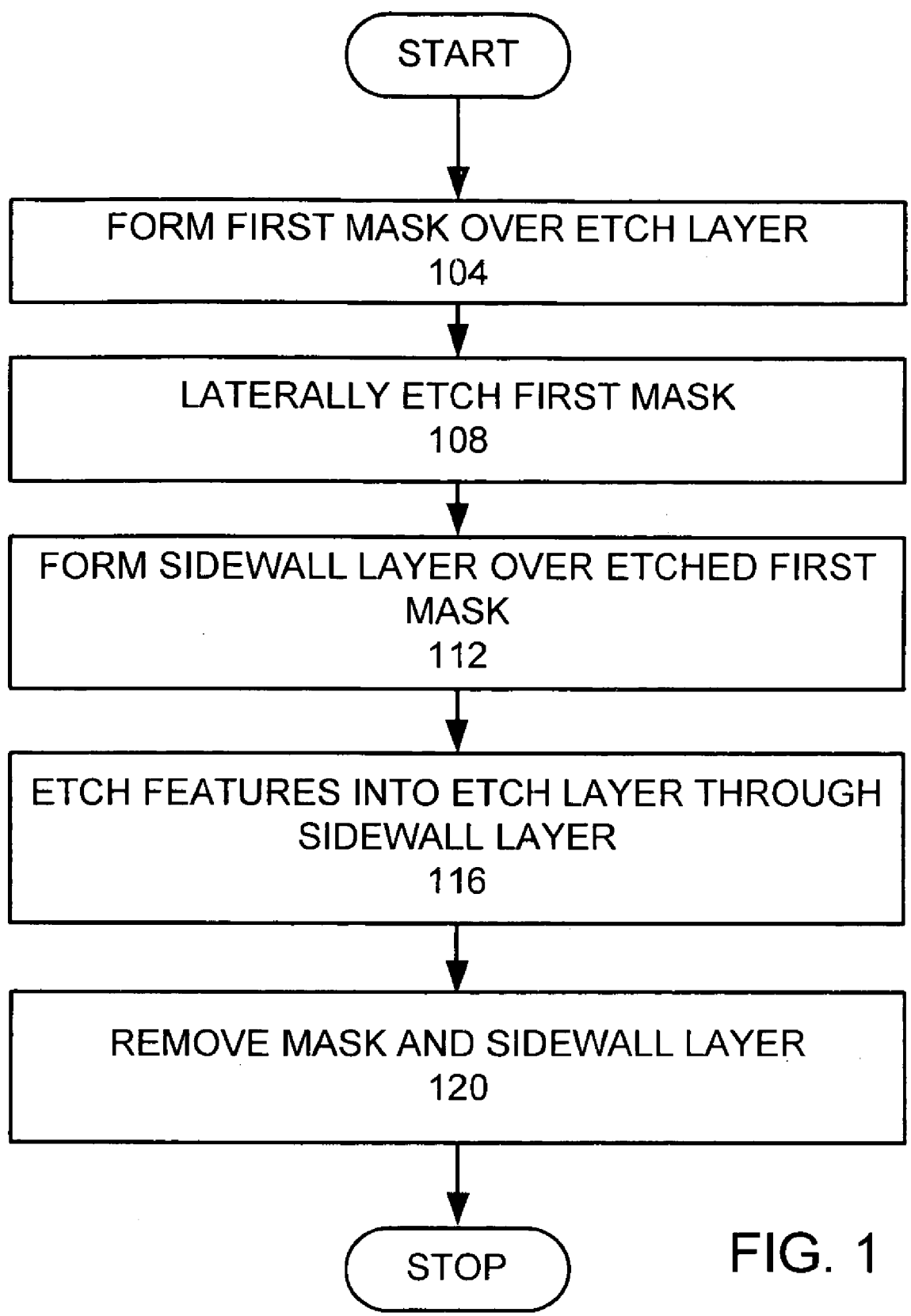
FIG. 1 is a high level flow chart of a process that may be used in an embodiment of the invention.
Figure 2:
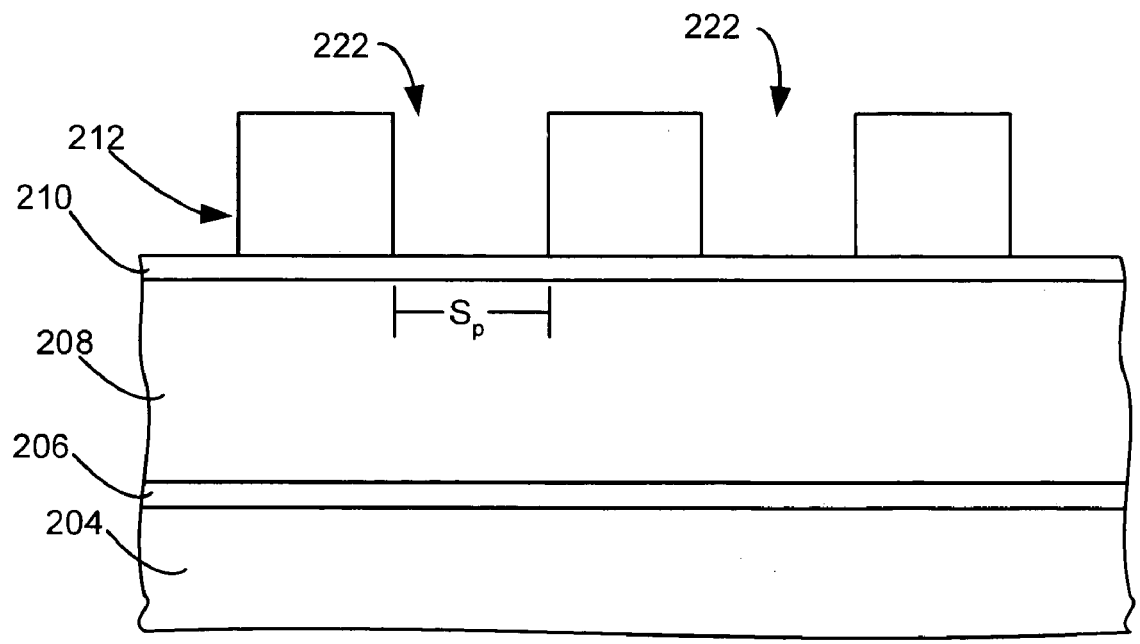
FIGS. 2A-D are schematic cross-sectional views of an etch layer processed according to an embodiment of the invention.
Figure 2:
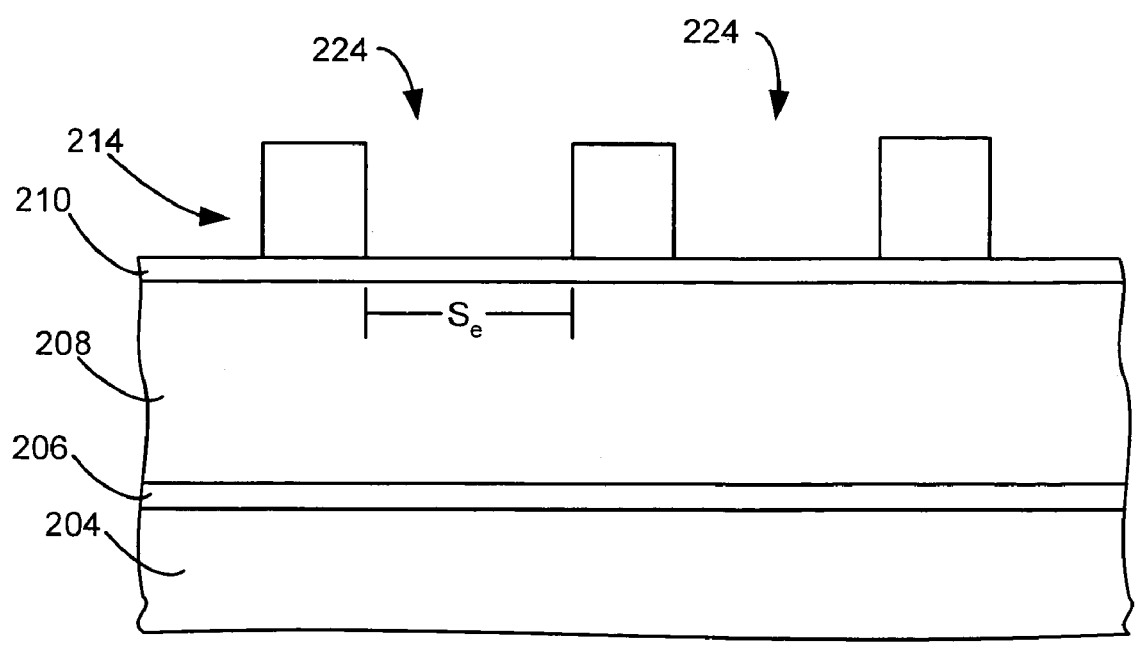
Figure 2:
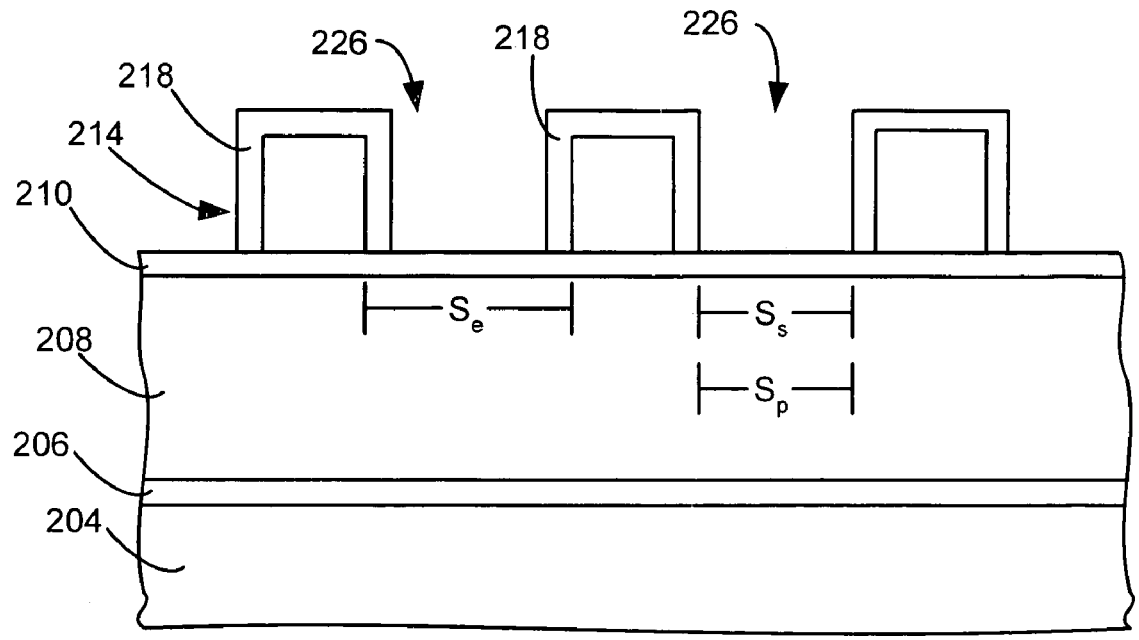
Figure 2:
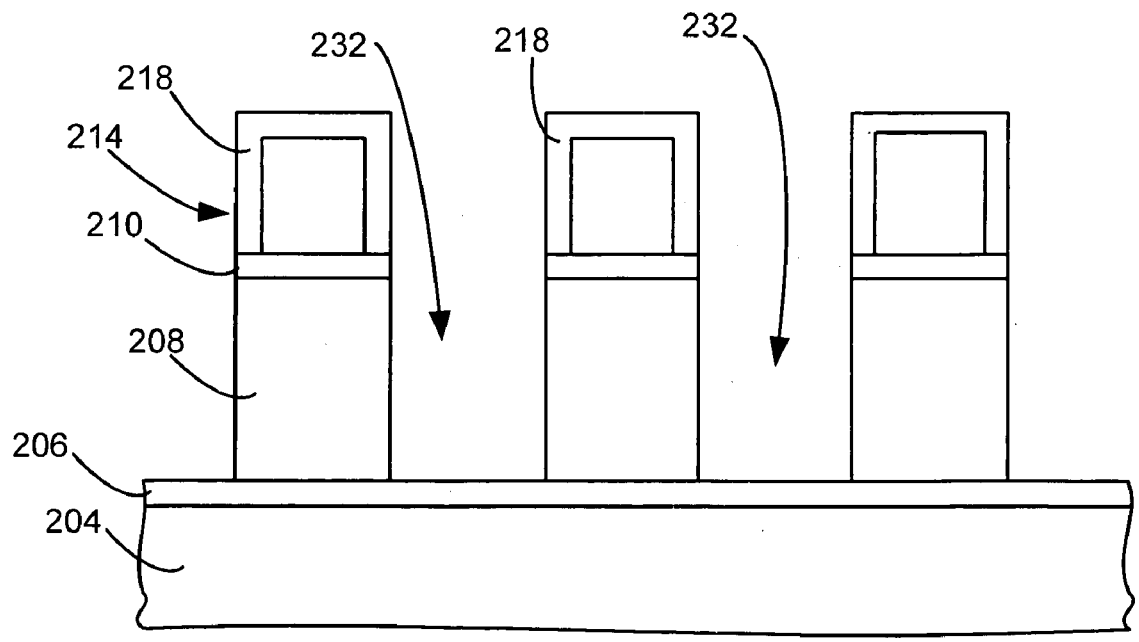

To facilitate understanding, FIG. 1 is a high level flow chart of a process that may be used in an embodiment of the invention. A first mask is formed over an etch layer disposed over a substrate (step 104). FIG. 2A is a cross-sectional view of a patterned mask in an embodiment of the invention. Over a substrate 204, such as a wafer a barrier layer 206 may be placed. Over the barrier layer 206 an etch layer 208 such as a conductive metal layer or a polysilicon layer or a dielectric layer is formed. Over the etch layer 208 an antireflective layer (ARL) 210 such as a DARC layer is formed. A patterned first mask 212 is formed over the ARL 210. The spaces 222 in the photoresist mask have a width "$S_p$", as shown.

The first photoresist mask is laterally etched (step 108) so that spaces 224 in the etched first photoresist mask 214 have widths "$S_e$" that are greater than the widths "$S_p$" of the spaces in the etched first mask, as shown in FIG. 2B. In the specification and claims, a lateral etch is defined as an etch of sides of a mask which form spaces (apertures), wherein the lateral etch increases the size of the spaces. For a trench mask, such a lateral etch may be a trimming of the trench mask. Such lateral etches may also reduce the thickness of the mask.

A sidewall layer is formed over the mask to reduce the widths of the spaces in the etched first mask (step 112). FIG. 2C is a schematic cross-sectional view of the etched first photoresist mask 214 with a sidewall layer 218 deposited over the sidewalls of the etched first photoresist mask 214. The sidewall layer 218 forms reduced spaces 226. In this example, the spaces 226 formed by the sidewall layer 218 have widths $S_s$, which are about equal to the widths $S_p$ of the photoresist mask. It is also desirable that the sidewall layer has substantially vertical sidewalls, which are highly conformal as shown. An example of a substantially vertical sidewall is a sidewall that from bottom to top makes an angle of between 88° to 90° with the bottom of the feature. Conformal sidewalls have a deposition layer that has substantially the same thickness from the top to the bottom of the feature. Non-conformal sidewalls may form a faceting or a bread-loafing formation, which provide non-substantially vertical sidewalls. Tapered sidewalls (from the faceting formation) or bread-loafing sidewalls may increase the deposited layer CD and provide a poor etching mask. Preferably, the deposition on the side wall is thicker than the deposition on the bottom of the first mask feature. More preferably, no layer is deposited over the bottom of the first mask feature. In this example, the sidewall layer 218 also forms a layer over the top of the photoresist mask 214 as shown. In other embodiments, the sidewall layer does not form a layer over the top of the photoresist mask.

Features are then etched into the etch layer 208 through the sidewall layer spaces (step 116). FIG. 2D shows a set of features 232 etched into the etch layer 208.

The sidewall layer 218 is of a material that is more etch resistant than the photoresist mask 214, allowing for increased etch selectivity. In addition, the sidewall layer is made of a material that is chosen to prevent photoresist line wiggling, line edge roughness, and striation.

The sidewall layer and photoresist mask are then removed (step 120). Preferably, a single mask stripping step in the etch chamber is used to both strip the photoresist mask and sidewall layer.

Via First Dual Damascene Embodiment

Figure 3:
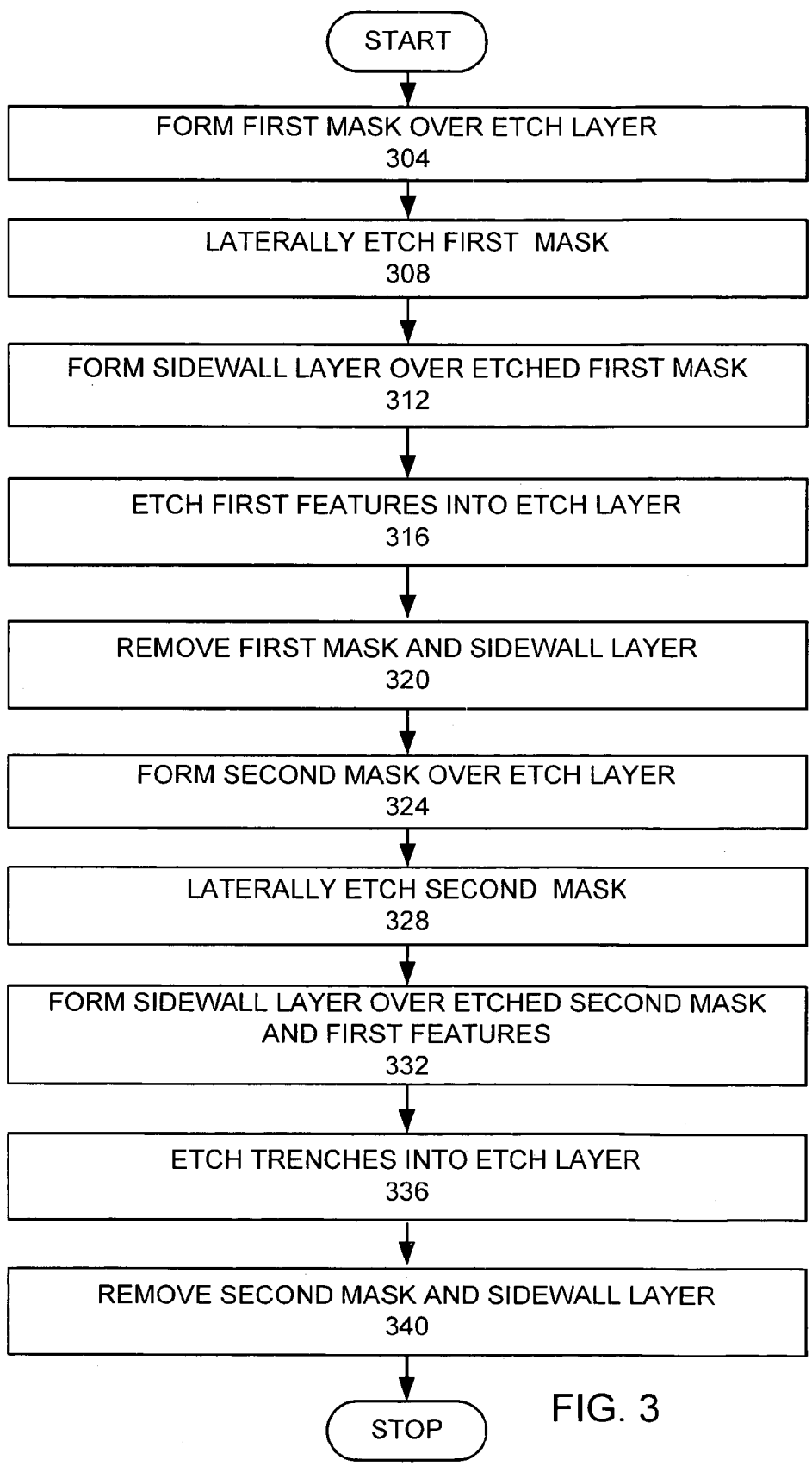
FIG. 3 is a high level flow chart of a process that may be used in another embodiment of the invention.
Figure 4:
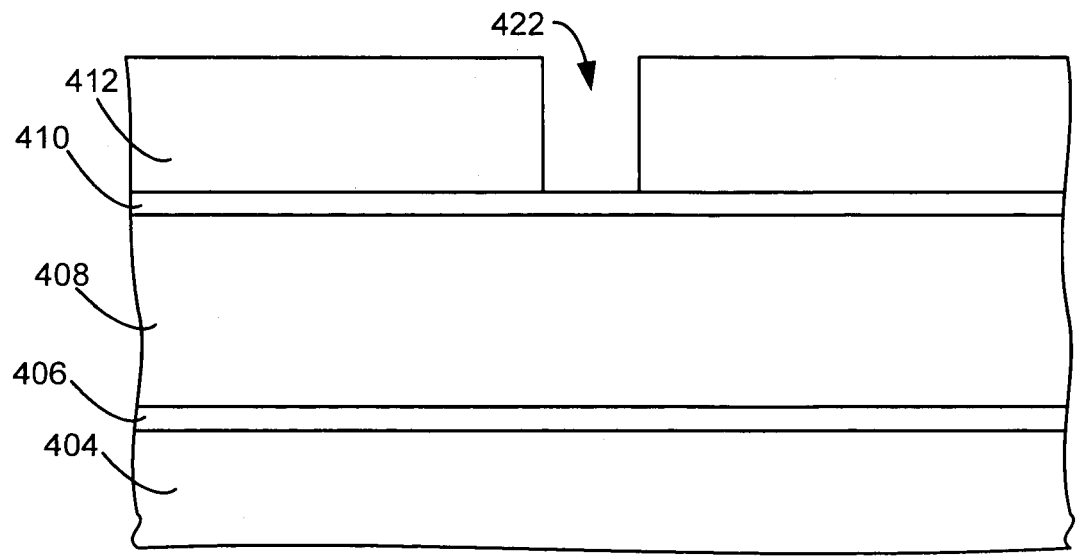
FIGS. 4A-H are schematic cross-sectional views of an etch layer processed according to another embodiment of the invention.
Figure 4:
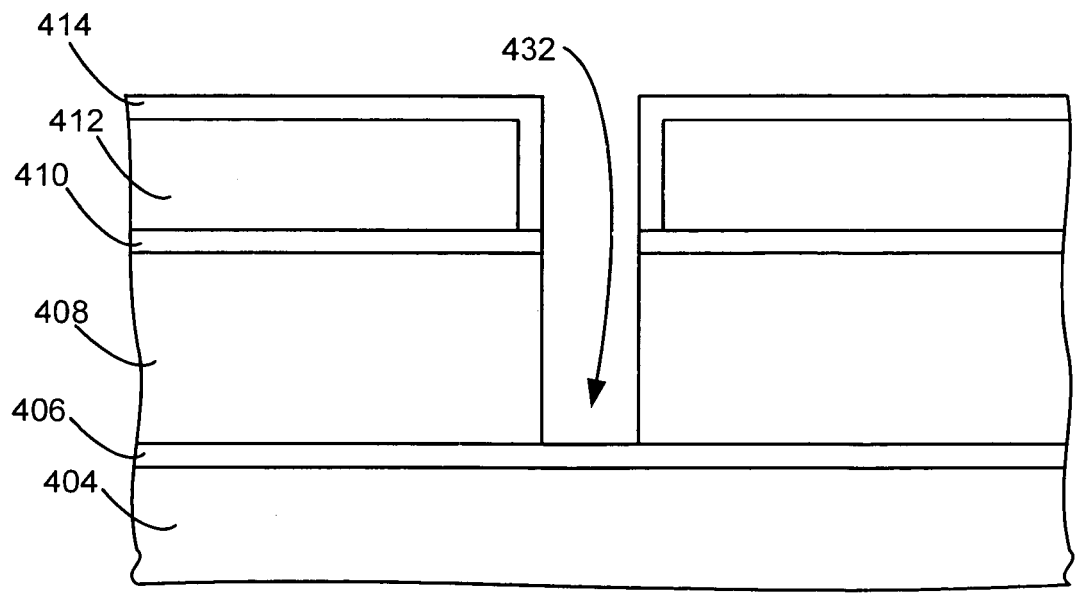
Figure 4:
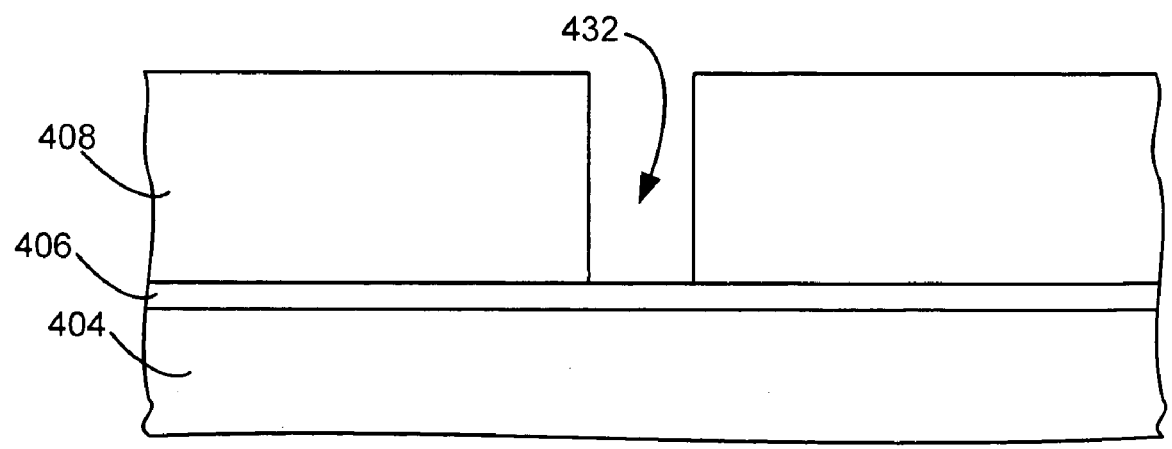
Figure 4:
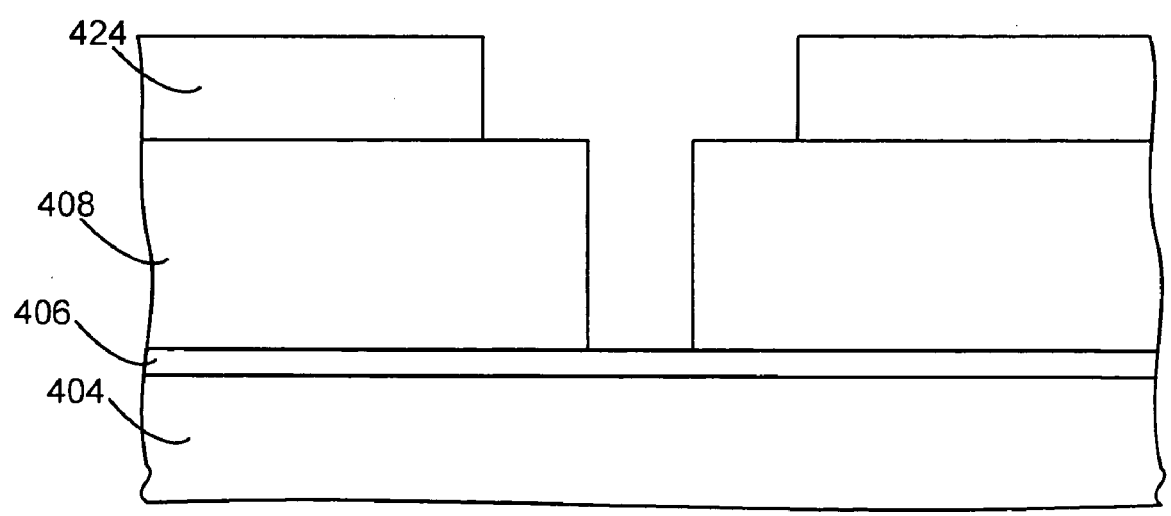
Figure 4:
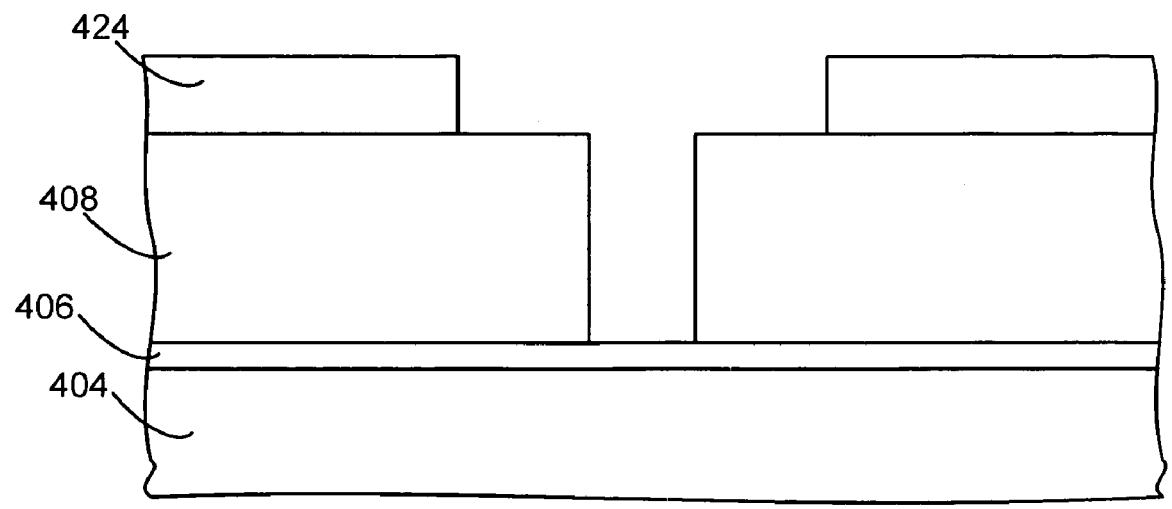
Figure 4:
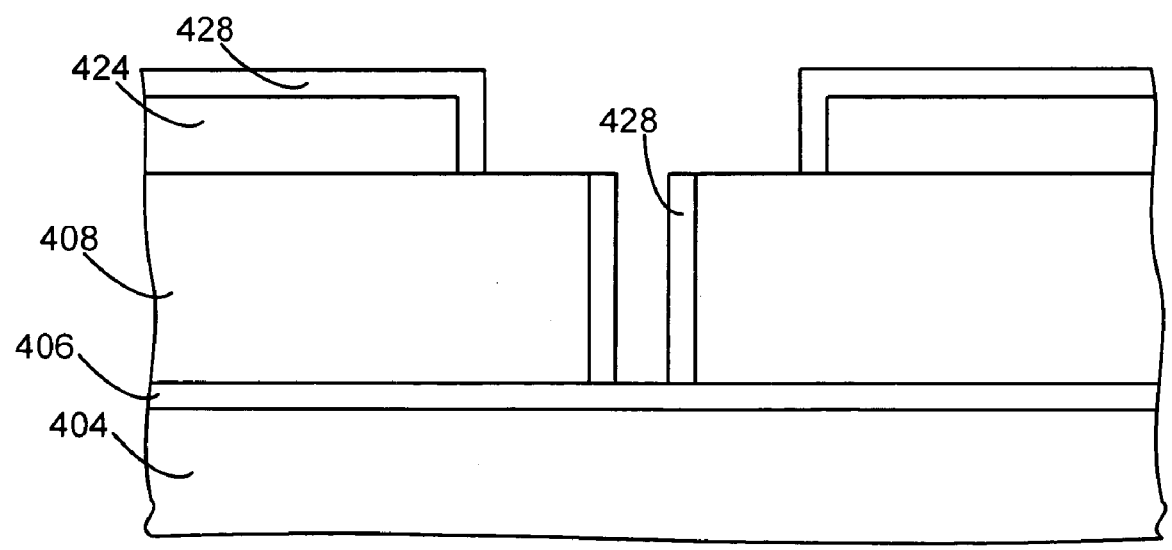
Figure 4:
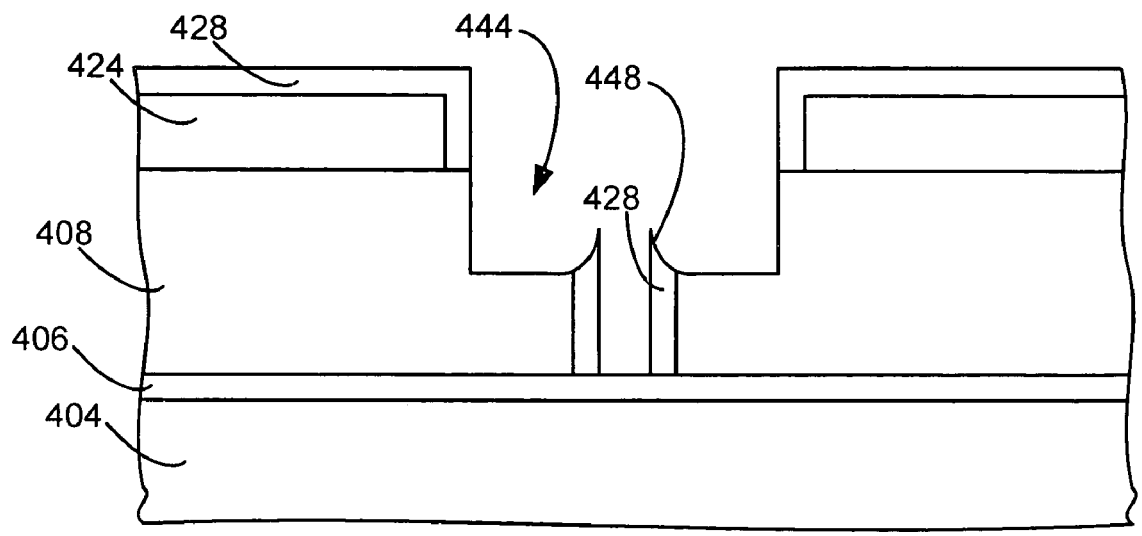
Figure 4:
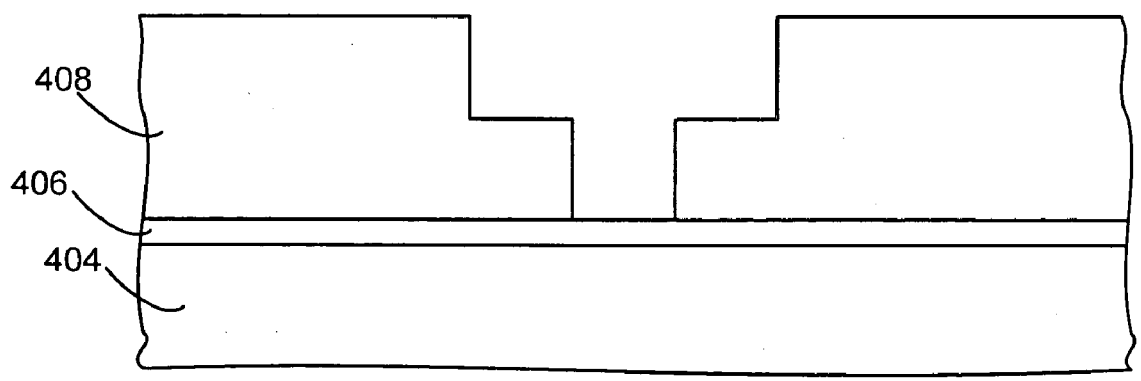

In another embodiment of the invention, the invention is used in a dual damascene via first process. FIG. 3 is a high level flow chart of the process used in this embodiment. A first mask is formed over an etch layer disposed over a substrate (step 304). FIG. 4A is a cross-sectional view of a patterned mask in an embodiment of the invention. Over a substrate 404, such as a wafer a barrier layer 406 may be placed. Over the barrier layer 406 an etch layer 408 such as a dielectric layer is formed. Over the etch layer 408 an antireflective layer (ARL) 410 such as a DARC layer is formed. A patterned first mask 412 is formed over the ARL 410. In this embodiment, the first mask is a via mask. The first mask has at least one space 422 for forming a via.

The first photoresist mask is laterally etched (step 308) so that spaces 424 in the etched first photoresist mask 414 have widths that are greater than the widths of the spaces in the etched first mask, as shown in FIG. 4B. A sidewall layer 414 is formed over the mask to reduce the widths of the spaces in the etched first mask (step 312). First features 432 are then etched into the etch layer 408 through the sidewall layer spaces (step 316). In this embodiment, the first features 432 are vias. The first mask and sidewall layer are then removed (step 320), as shown in FIG. 4C.

A second mask 424 is formed over the etch layer (step 324), as shown in FIG. 4D. In this embodiment, the second mask 424 is a trench mask. The second mask 424 is laterally etched (step 328), as shown in FIG. 4E. A sidewall layer 428 is formed over the etched second mask 424 and first features, as shown in FIG. 4F. Trenches 444 are etched into the etch layer 408 through the sidewall layer 428, as shown in FIG. 4G. In this embodiment, the sidewall layer 428 in the via may cause some fencing 448.

The second mask and sidewall layer are then removed (step 340), as shown in FIG. 4H. The fence may be removed during this step or may be removed with an additional step. In addition to using the sidewall layer to protect the photoresist masks to increase etch selectivity and reduce wiggling, line edge roughening, and striation, this embodiment uses the sidewall layer over the sidewalls of the vias to prevent notching and bowing of the vias during the trench etch. It is believed that etch resistant sidewall layers over the via sidewalls provide more protection to reduce or eliminate notching. The formation of sidewalls over the sidewalls of the via is advantageous over via plugs, since such sidewalls may provide an improved trench etch and are more easily removed, minimizing damage during the removal process.

Using Gas Modulation to Form Sidewalls

In the preferred embodiment, gas modulation is used to form the conformal sidewalls. Preferably the sidewalls are formed of a polymer material and the mask is a photoresist polymer, so that the deposition of the sidewall layer may be performed in situ in the same chamber were the etching and stripping are performed, and so that the stripping may remove both the mask and the sidewall layer.

Figure 5:
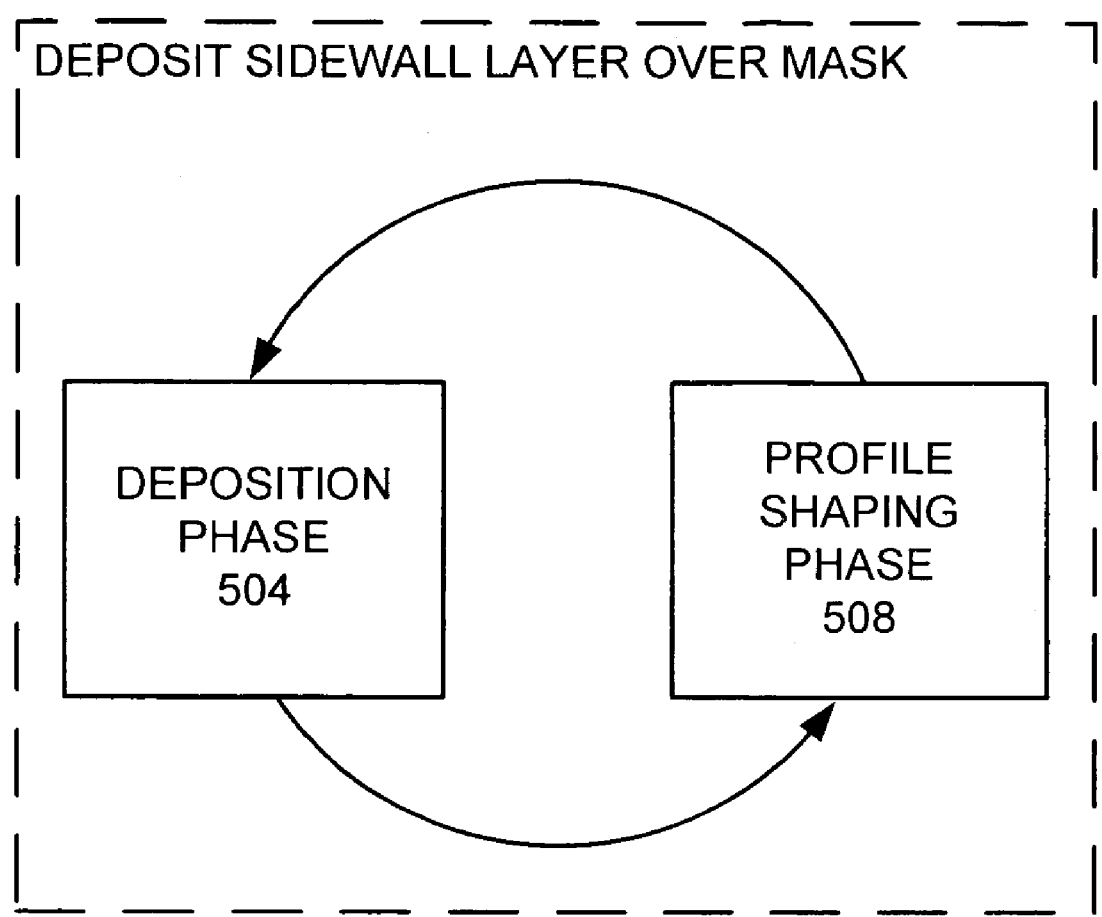
FIG. 5 is a more detailed flow chart of the step of depositing a sidewall layer.

FIG. 5 is a more detailed flow chart of the forming a sidewall layer over the mask (steps 112, 312, and 332), which uses gas modulation. In this embodiment, the forming the sidewall layer over the mask (steps 112, 312, and 332) comprises a deposition phase 504 and a profile shaping phase 508. The deposition phase uses a first gas chemistry to form a plasma, which deposits a sidewall layer over the sidewalls of the mask. The profile shaping phase 508 uses a second gas chemistry different than the first gas chemistry to form a plasma, which shapes the profile of the deposition.

The invention may be used for etching a dielectric layer or a conductive layer. Example recipes that may be used to practice the invention for dielectric or conductive layers are provided below:

EXAMPLE PROCESS

Figure 6:
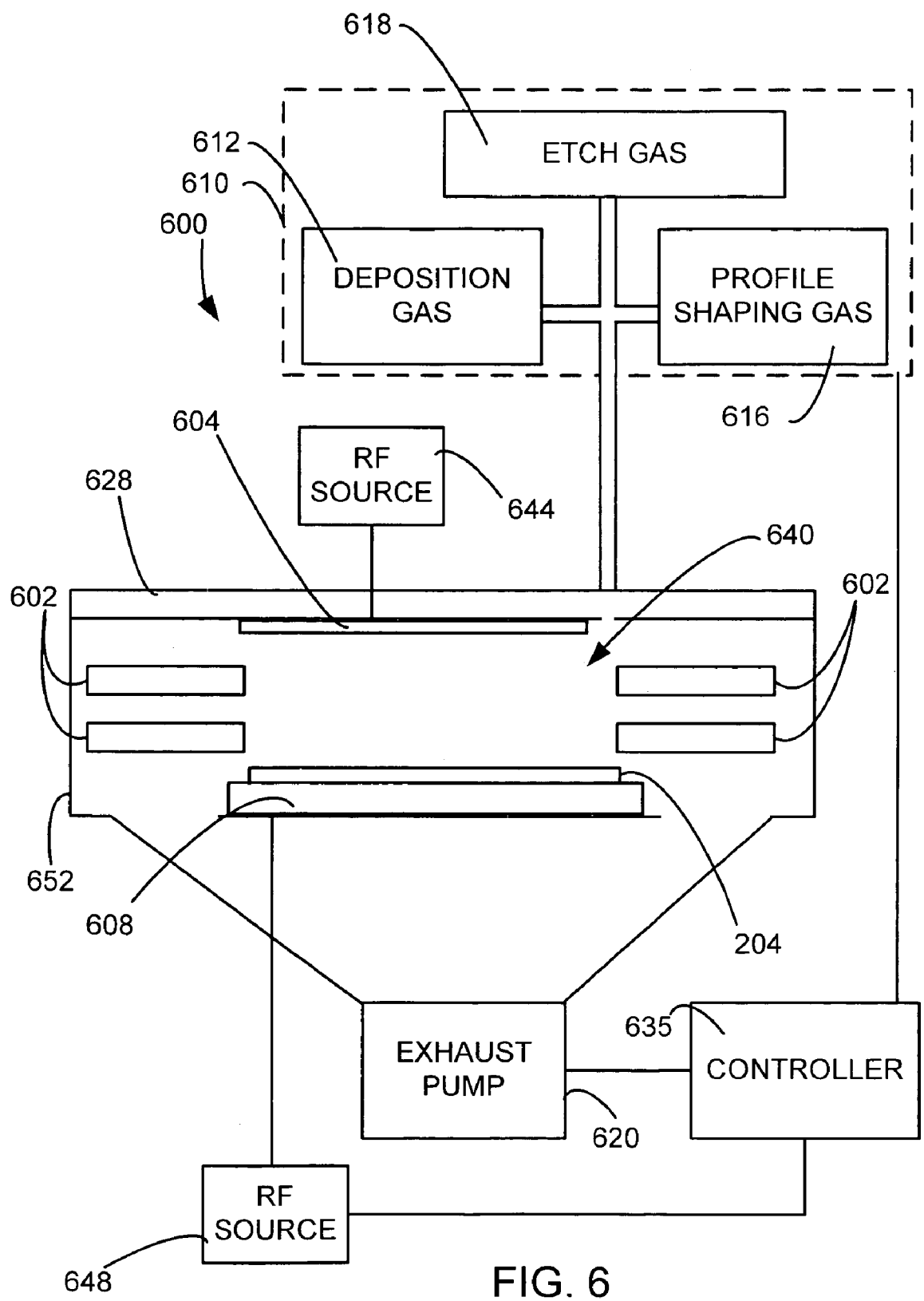
FIG. 6 is a schematic view of a plasma processing chamber that may be used in practicing the invention.

In an example of the inventive process, the etch layer 208 is a dielectric layer. A photoresist mask is formed over the dielectric layer 208 (step 104). The substrate 204 is then placed in a plasma processing chamber. FIG. 6 is a schematic view of a plasma processing chamber 600 that may be used for depositing the sidewall layer, etching, and stripping. The plasma processing chamber 600 comprises confinement rings 602, an upper electrode 604, a lower electrode 608, a gas source 610, and an exhaust pump 620. The gas source 610 comprises a deposition gas source 612 and a profile shaping gas source 616. The gas source 610 may comprise additional gas sources, such as an etching gas source 618. Within plasma processing chamber 600, the substrate 204 is positioned upon the lower electrode 608. The lower electrode 608 incorporates a suitable substrate chucking mechanism (e.g., electrostatic, mechanical clamping, or the like) for holding the substrate 204. The reactor top 628 incorporates the upper electrode 604 disposed immediately opposite the lower electrode 608. The upper electrode 604, lower electrode 608, and confinement rings 602 define the confined plasma volume. Gas is supplied to the confined plasma volume by the gas source 610 and is exhausted from the confined plasma volume through the confinement rings 602 and an exhaust port by the exhaust pump 620. A first RF source 644 is electrically connected to the upper electrode 604. A second RF source 648 is electrically connected to the lower electrode 608. Chamber walls 652 surround the confinement rings 602, the upper electrode 604, and the lower electrode 608. Both the first RF source 644 and the second RF source 648 may comprise a high frequency (27 to 300) MHz power source and a low frequency (2 to 14) MHz power source. Different combinations of connecting RF power to the electrode are possible. A controller 635 is controllably connected to the RF sources 644, 648, exhaust pump 620, and the gas source 610.

Figure 7A:
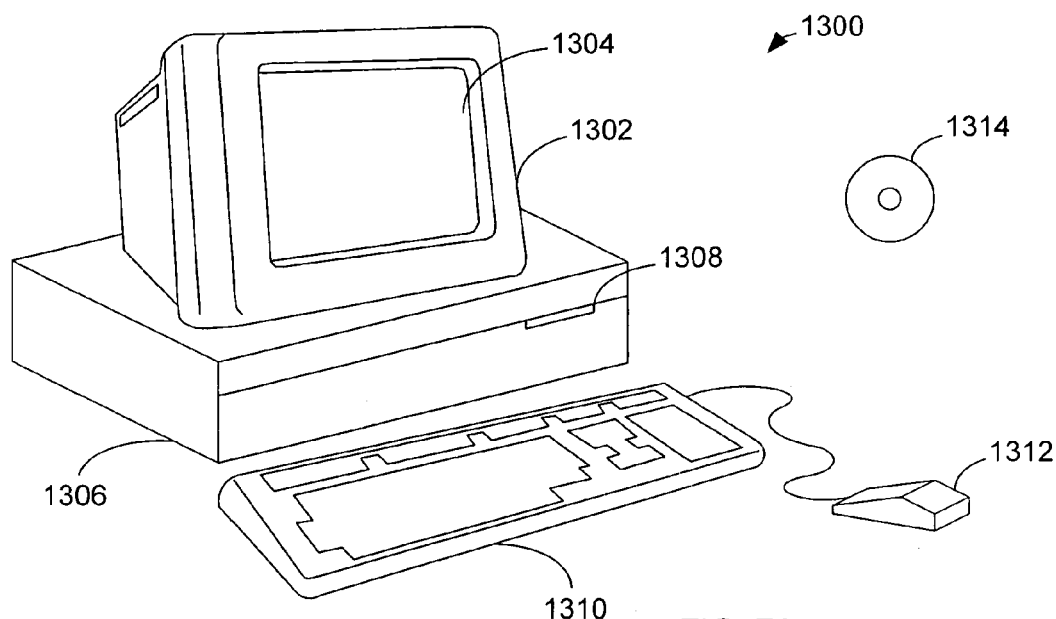
FIGS. 7A-B illustrate a computer system, which is suitable for implementing a controller used in embodiments of the present invention.
Figure 7B:
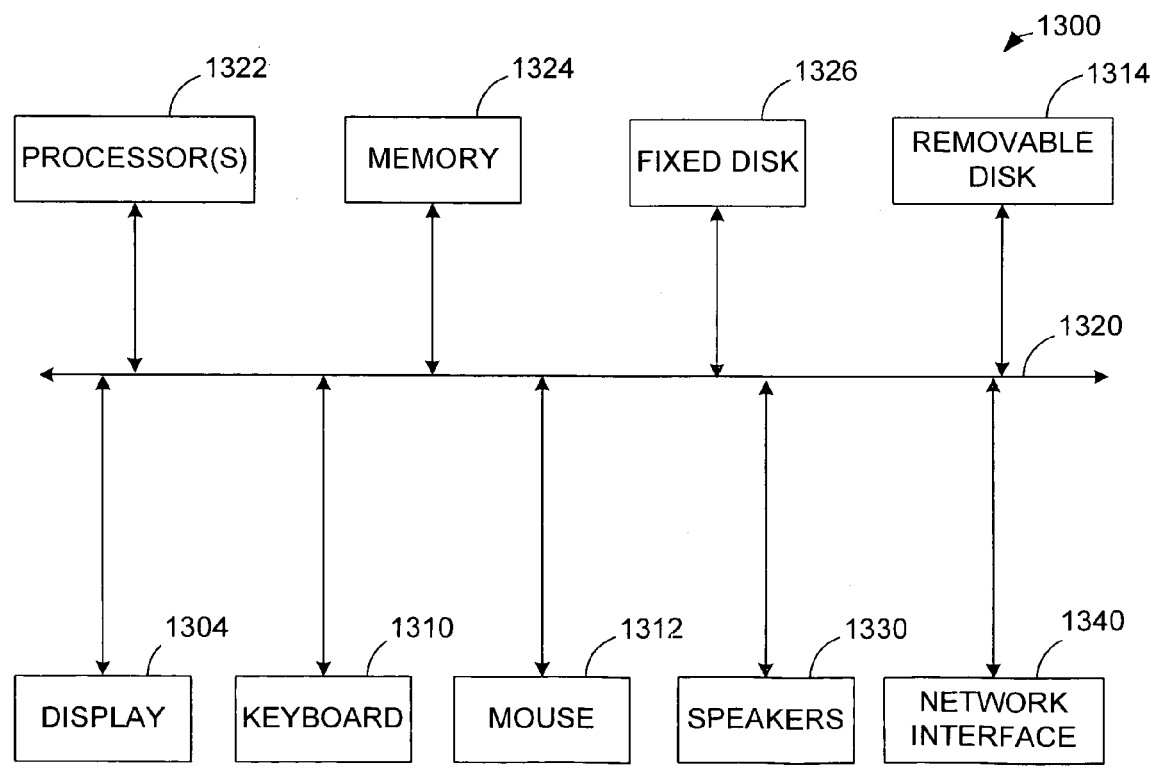

FIGS. 7A and 7B illustrate a computer system 1300, which is suitable for implementing a controller 635 used in embodiments of the present invention. FIG. 7A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a diskdrive 1308, a keyboard 1310, and a mouse 1312. Disk 1314 is a computer-readable medium used to transfer data to and from computer system 1300.

FIG. 7B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bidirectional manner. Both of these or other types of memories may include any suitable form of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330, and feedback and forward system for control of the process. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor. Other examples may use other deposition devices.

An example of a recipe for laterally etching the mask (steps 108, 308, and 32) provides an etch chamber or plasma processing chamber pressure of 1 to 300 mT. 50 to 800 Watts of power is supplied to the plasma processing chamber at 27 MHz. 0 to 200 sccm of $CF_4$ and 5 to 30 sccm of $O_2$ are provided to the plasma processing chamber. More preferably, the pressure for laterally etching the mask is between 20-150 mT.

One example of a deposition phase 504 may be $CH_3F$ deposition using a chemistry of 250 sccm (standard cubic centimeters per minute) Ar and 50 sccm $CH_3F$, at a pressure of 60 mTorr, established by setting a Vat valve of the turbo pump to 1000. The 27 MHz RF source provides 500 Watts of power, while the 2 MHz RF source provides 100 Watts of power. The chamber temperature is maintained at 20° C. A helium cooling pressure, to cool the substrate is 15 Torr. Such a recipe causes the formation of a polymer sidewall layer.

One example of a profile shaping phase 508 may be $C_4F_6/O_2/CO$ deposition using a chemistry of 270 sccm Ar, 12 sccm $C_4F_6$, 8 sccm $O_2$, and 100 sccm CO, at a pressure of 50 mTorr, established by setting a Vat valve of the turbo pump to 1000. The 27 MHz RF source provides 1500 Watts of power, while the 2 MHz RF source provides 480 Watts of power. The chamber temperature is maintained at 20° C. A helium cooling pressure, to cool the substrate is 15 Torr.

Figure 8:
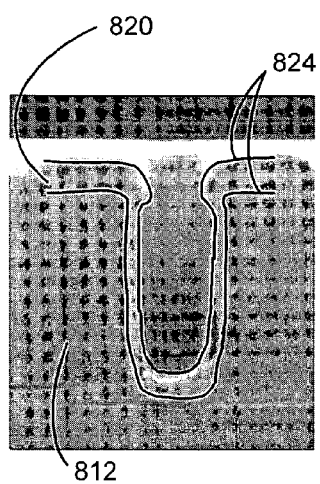
FIGS. 8A-C are cross-sectional views of depositions.
Figure 8:
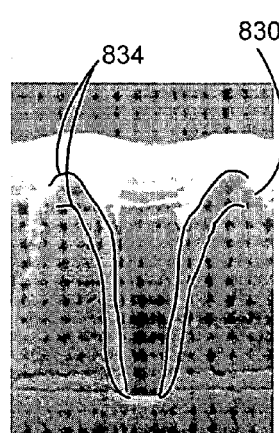
Figure 8:
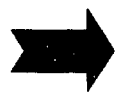
Figure 8:
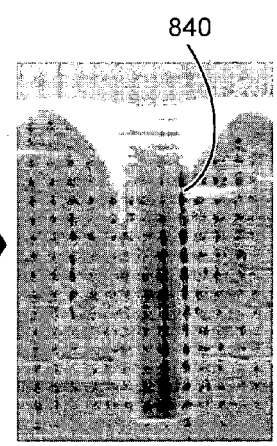

FIG. 8A is a cross-sectional view of a deposition layer 820 from the deposition phase. The deposition layer 820 is formed over a mask 812. In this example, the deposition phase forms a "bread-loafing" deposition layer as indicated by outlines 824. The bread-loafing deposition layer is characterized by a thicker sidewall deposition near the top of the feature and a thinner (or no) sidewall deposition near the bottom of the feature. In addition, the bread-loafing in this example forms a layer at over the very bottom surface of the feature, as shown. Therefore, this deposition provides a non-conformal sidewall deposition. Such a deposition does not provide the desired substantially vertical sidewalls. The bread-loafing eventually pinches off the top, which then cannot be used as a masking layer, since the contact will be closed off and no etching can be done.

FIG. 8B is a cross-sectional view of a deposition layer 830 where only the profiling shaping phase is used. In this example, the profile shaping phase forms a "faceting" deposition layer, as indicated by outlines 834. The faceting deposition layer is characterized by a thinner (or no) sidewall deposition near the top of the feature and a thicker sidewall deposition near the bottom of the feature. The "faceting" deposition does not deposit at the very bottom surface of the feature. Therefore, this deposition also provides a non-conformal sidewall deposition. If the sidewalls near the top are too thin, faceting of the photoresist mask may result. Such a deposition does not provide the desired substantially vertical sidewalls. The faceting of the corners of the photoresist mask may cause lower etch selectivity and fast mask erosion. The faceting of the mask will also result in faceting of the etched profile. In almost all cases, once the mask is faceted, then the final etched profile is also faceted, since the mask vertical profile generally translates into the etched material.

FIG. 8C is a cross-sectional view of a deposition layer 840 formed by 6 cycles of a 2 second deposition and 25 second profile shaping. As can be seen, the deposition layer has vertical sidewalls and little or no deposition at the bottom surface of the feature. To provide a 6 cycle process of multiple phases, a gas-modulation device, which is able to alternate gas recipes quickly, would be a preferred apparatus.

The ability to control the ratio of the times of the deposition phase 504 and the profile shaping phase 508 provide another control variable. A proper ratio will provide substantially vertical and conformal sidewalls as illustrated in FIG. 8C. Such a deposition layer is also able to protect the photoresist mask to increase etch selectivity. Other control parameters provided by the invention that can be used to control the deposition profiles are: number of cycles, total deposition time, deposition/shaping phase time ratio, gas chemistry types, and ratios. Gas chemistries that may be used by the invention may be $C_xH_yF_z$ or $C_xF_y$ with or without $O_2$ (such as $CH_3F/O_2$, $C_4F_6/O_2$, $CH_2F_2$, $CHF_3$, $CF_4$) or may be $H_2$, $CH_4$, $C_2H_4$, $SiH_4$, etc. Preferably, the deposition phase uses a chemistry of a hydrocarbon and a fluorocarbon. Preferably, the hydrocarbon is at least one of $CH_4$ and $C_2H_4$. The fluorocarbon is preferably at least on of $CH_3F$, $CH_2F_2$, $CHF_3$, $C_4F_6$, and $C_4F_8$. Other gas mixtures that may preferably be used during the deposition phase are $CF_4$ and $H_2$. Preferably, the profile shaping phase uses a chemistry of a fluorocarbon with or without other additives. Preferably, the fluorocarbon is at least one of $CH_2F_2$, $CHF_3$, and $CF_4$. Preferably, the other additive is at least one of Ar, Xe, He, Ne, $O_2$, $N_2$, and $H_2$.

The multiphase deposition allows a profile shaping step to remove unwanted deposition. In addition, a single long deposition may cause blistering. Preferably, the profile shaping step also densities the polymer by bombarding the polymer with ions. Using multiple cycles for forming the deposition layers also provides finer CD control. In addition, the multiple cycle multiple phase deposition provides profile control. The reduction of bread loafing reduces shading, which improves etch profiles. In addition, the multiple cycle, multiple phase deposition reduces line wiggling, which is caused by the stress of a deposition layer, which causes the photoresist lines to wiggle. In addition, the profile shaping step prevents or reduces deposition on the bottom of the mask feature, to prevent residue from the deposition, which would come from resputtered material from the deposition layer that would be at the bottom of the mask feature.

Preferably, at least two cycles are used in the forming the deposition layer. More preferably, at least six cycles are used in forming the deposition layer. Some embodiments use at least twelve cycles.

Other embodiments may use a hardmask for the mask. In such embodiments, a photoresist mask may be used to open a hardmask. The sidewall layer may be placed over the photoresist mask to reduce line wiggling, line edge roughness, and striation.

Spaces in the mask may be used to etch holes or trenches in the etch layer.

The invention may be used on many different types of plasma processing tools such as Exelan and TCP type etcher, hybrid PVD, CVD, MW, RIE, MORIE, TCP, ICP, etc.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for forming features in an etch layer, comprising:

forming a first mask over the etch layer wherein the first mask defines a plurality of spaces with widths;

laterally etching the first mask wherein the etched first mask defines a plurality of spaces with widths, wherein the widths of the spaces of the etched first mask are greater than the widths of the spaces of the first mask;

forming a sidewall layer over the etched first mask wherein the sidewall layer defines a plurality of spaces with widths that are approximately equal to the plurality of spaces defined by said forming a first mask over the etch layer;

etching features into the etch layer through the sidewall layer, wherein the features have widths that are smaller than the widths of the spaces defined by the etched first mask;

removing the mask and sidewall layer.

2. The method, as recited in claim 1, wherein the forming sidewall layer over the etched first mask is at least one cycle, comprising:

a deposition phase with a first gas chemistry to form a deposition plasma to form a deposition over the sidewalls of the first mask; and a profile shaping phase with a second gas chemistry to shape the profile of the deposition over the sidewalls of the first mask, wherein the first gas chemistry is different than the second gas chemistry.

3. The method, as recited in claim 2, wherein the forming the sidewall layers over the etched first mask is performed for at least two cycles.

4. The method, as recited in claim 3, wherein the forming the sidewall layer forms substantially vertical sidewalls.

5. The method, as recited in claim 3, further comprising placing the etch layer in a plasma processing chamber wherein the laterally etching the first mask, the forming the sidewall layer, and etching features are done within the plasma processing chamber.

6. The method, as recited in claim 3, wherein the first mask is a photoresist mask, and wherein the sidewall layers are formed from at least one of an amorphous carbon material and polymer material.

7. The method, as recited in claim 6, further comprising stripping the photoresist mask and sidewall layer with a single stripping step.

8. The method, as recited in claim 7, wherein the stripping the photoresist mask and sidewall layer comprises ashing the photoresist mask and sidewall layer.

9. The method, as recited in claim 8, wherein the ashing the photoresist mask and sidewall layer is performed in the same plasma processing chamber as forming the sidewall layer and etching.

10. The method, as recited in claim 1, wherein the fast mask is a via mask and the etching features etches vias into the etch layer, further comprising;
    forming a trench mask over the etch layer;
    forming a sidewall layer over trench mask and sidewalls of the vias;
    etching trenches into the etch layer through the trench mask; and
    removing the trench mask and sidewall layer.

11. The method, as recited in claim 10, further comprising laterally etching the trench mask before forming a sidewall layer over the trench mask.

12. A semiconductor device formed by the method of claim 1.

13. A method for forming features in an etch layer, comprising:
    etching a plurality of vias into the etch layer;
    forming a trench photoresist mask, wherein the trench photoresist mask defines a plurality of spaces with widths;
    laterally etching said trench photoresist mask;
    forming a sidewall layer over the trench mask and on sidewalls of the plurality of vias, wherein the sidewall layer defines a plurality of spaces having widths approximately equal to the widths of the plurality of spaces defined by the trench photoresist mask by said forming the wench photoresist mask;
    etching trenches into the etch layer through the sidewall layer.

14. The method, as recited in claim 13, wherein the forming sidewall layer over the trench mask and on sidewalk of the plurality of vias comprises at least two cycles, wherein each cycle comprises;
    a deposition phase with a first gas chemistry to form a deposition plasma to form a deposition over the sidewalk of the first mask; and
    a profile shaping phase with a second gas chemistry to shape the profile of the deposition over the sidewalls of the first mask, wherein the first gas chemistry is different than the second gas chemistry.

15. The method, as recited in claim 14, further comprising placing the etch layer in a plasma processing chamber wherein the forming the sidewall layer, etching, and removing the mask and sidewall layer are done within the plasma processing chamber.

16. The method, as recited in claim 15, wherein the sidewall layer is of a polymer material.

17. The method, as recited in claim 16, further comprising laterally etching the trench photoresist mask before forming the sidewall layer over the trench mask and sidewalls of the plurality of vias.

* * * * *